United States Patent
Hikmet et al.

(10) Patent No.: US 10,334,686 B2
(45) Date of Patent: Jun. 25, 2019

(54) LIGHT EMITTING MODULE, A LAMP, A LUMINAIRE AND A METHOD OF ILLUMINATING AN OBJECT

(71) Applicant: SIGNIFY HOLDING B.V., Eindhoven (NL)

(72) Inventors: Rifat Ata Mustafa Hikmet, Eindhoven (NL); Ties Van Bommel, Eindhoven (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 0 days.

(21) Appl. No.: 15/117,565

(22) PCT Filed: Feb. 23, 2015

(86) PCT No.: PCT/EP2015/053671
§ 371 (c)(1),
(2) Date: Aug. 9, 2016

(87) PCT Pub. No.: WO2015/124755
PCT Pub. Date: Aug. 27, 2015

(65) Prior Publication Data
US 2016/0366745 A1    Dec. 15, 2016

(30) Foreign Application Priority Data
Feb. 21, 2014    (EP) ..................... 14156148

(51) Int. Cl.
*H05B 33/08*    (2006.01)
*H01L 25/075*    (2006.01)
(Continued)

(52) U.S. Cl.
CPC .......... *H05B 33/0857* (2013.01); *C09K 11/00* (2013.01); *F21K 9/232* (2016.08);
(Continued)

(58) Field of Classification Search
CPC ......... H05B 33/0857; F21K 9/60; F21K 9/64; F21K 9/232; H01L 25/0753;
(Continued)

(56) References Cited

U.S. PATENT DOCUMENTS 7,679,281 B2 * 3/2010 Kim ..................... F21K 9/00
257/98
2003/0227022 A1    12/2003 Hwang et al.
(Continued)

FOREIGN PATENT DOCUMENTS

CN    103503179 A    1/2014
EP    2190035 A1    5/2010
(Continued)

*Primary Examiner* — Elmito Breval
(74) *Attorney, Agent, or Firm* — Akarsh P. Belagodu

(57) ABSTRACT

A light emitting module (100), a lamp and a luminaire are provided. The light emitting module is for illuminating an object and comprises a first light emitting module (102) and a second light emitting module (104). The first light emitting module emits first light (L1). The first light has a color point of white light. The second light emitting element emits a peak of blue light (L2). The peak of blue light has a peak wavelength in a range from 440 nanometer to 470 nanometer and has a spectral width that is smaller than 70 nanometers, the spectral width being expressed as a full width half maximum value.

15 Claims, 6 Drawing Sheets

(51) Int. Cl.
  *H01L 33/50* (2010.01)
  *C09K 11/00* (2006.01)
  *F21K 9/60* (2016.01)
  *F21K 9/232* (2016.01)
  *F21K 9/64* (2016.01)
  *F21V 9/30* (2018.01)
  *F21V 33/00* (2006.01)
  *F21S 8/06* (2006.01)
  *F21Y 115/10* (2016.01)
  *F21Y 113/13* (2016.01)

(52) U.S. Cl.
  CPC ............... *F21K 9/60* (2016.08); *F21K 9/64* (2016.08); *H01L 25/0753* (2013.01); *H01L 33/504* (2013.01); *F21S 8/06* (2013.01); *F21V 9/30* (2018.02); *F21V 33/006* (2013.01); *F21Y 2113/13* (2016.08); *F21Y 2115/10* (2016.08); *H01L 33/50* (2013.01); *H01L 2924/0002* (2013.01); *Y02B 20/181* (2013.01)

(58) Field of Classification Search
  CPC ............... H01L 33/504; H01L 33/50; H01L 2924/0002; C09K 11/00; F21Y 2113/13; F21Y 2115/10; F21V 9/30; F21V 33/006; F21S 8/06; Y02B 20/181
  See application file for complete search history.

(56) References Cited

U.S. PATENT DOCUMENTS

| | | | |
|---|---|---|---|
| 2011/0037415 A1* | 2/2011 | Juestel | F21K 9/00 315/297 |
| 2011/0220929 A1 | 9/2011 | Collins et al. | |
| 2013/0075769 A1 | 3/2013 | Yan et al. | |
| 2013/0114242 A1 | 5/2013 | Pickard et al. | |
| 2013/0258636 A1 | 10/2013 | Rettke | |
| 2015/0049459 A1* | 2/2015 | Peeters | H01L 25/0753 362/84 |

FOREIGN PATENT DOCUMENTS

| | | |
|---|---|---|
| JP | 2003045206 A | 2/2003 |
| WO | WO2012144089 A1 | 10/2012 |
| WO | WO2013150470 A1 | 10/2013 |
| WO | WO2014006597 A1 | 1/2014 |

* cited by examiner

LIGHT EMITTING MODULE, A LAMP, A LUMINAIRE AND A METHOD OF ILLUMINATING AN OBJECT

CROSS-REFERENCE TO PRIOR APPLICATIONS

This application is the U.S. National Phase application under 35 U.S.C. § 371 of International Application No. PCT/EP2015/053671, filed on Feb. 23, 2015, which claims the benefit of European Patent Application No. 14156148.0, filed on Feb. 21, 2014. These applications are hereby incorporated by reference herein.

FIELD OF THE INVENTION

The invention relates to the field of light emitting modules for illuminating an object or an environment.

The invention further relates to a lamp, a luminaire and a method of illuminating an object or an environment.

BACKGROUND OF THE INVENTION

It is known to use in several products so-termed "brighteners". The brighteners absorb a portion of the light (e.g. UV light) that impinges on them and converts the absorbed light towards light of another color. This additional light of another color results in the fact that the human naked eye experiences the color of the object as a more appealing color, as a more crispy color. For example, brighteners are added to white paper such that the paper appears to be whiter to the human naked eye. The light that is reflected by the white paper in combination with the light generated by the brighteners is often termed "crispy white light". If this white paper with brighteners is laid beside a 100% reflecting white object (without brighteners), the human naked eye experiences the white paper as more white and experiences the white of the 100% reflecting white object as an object that is slightly grey or slightly yellow/orange. The effect of the brighteners can be well seen under natural daylight, and, for example, high pressure incandescent lamps. However, most LED based light sources do not reveal the effect of the brighteners and studies have shown that in particular Ultraviolet (more in particular, UVA light) or violet light excite the brighteners. LED based light sources do, in general, not emit much light in these UVA or violet spectral ranges.

Published patent application WO2013/150470, which is included by reference, provides a solution for the problem that most LED based light sources emit light that does not lead to the excitation of light by the brighteners. According to WO2013/150470, in a light source which comprises a phosphor converted light emitter (for emitting, for example, white light), an additional light emitter is provided which emits violet light in the spectral range from 400 to 440 nanometer such that, when the emitted light impinges on an object with brighteners, the brighteners absorb the violet light and emit the light of another color.

With the solution of the cited patent application, one still has to add brighteners to the product that has to look more appealing and/or more crispy when being illuminated by the light source of the patent application.

SUMMARY OF THE INVENTION

It is an object of the invention to provide a light source for illuminating an object to-be-illuminated and obtaining the effect of the use of brighteners without actually using the brighteners in the to-be-illuminated objects.

An aspect of the invention provides a light emitting module. Another aspect of the invention provides a lamp. A further aspect of the invention provides a luminaire. Yet another aspect of the invention provides a method of illuminating an object. Advantageous embodiments are defined in the dependent claims.

A light emitting module for illuminating an object in accordance with an aspect of the invention comprises a first light emitting module and a second light emitting module. The first light emitting module emits first light. The first light has a color point of white light. The second light emitting element emits a peak of blue light. The peak of blue light has a peak wavelength in a range from 440 nanometer to 470 nanometer and has a spectral width that is smaller than 70 nanometers, the spectral width being expressed as a full width half maximum value.

It is an insight of the inventors that when a light emitting module is provided which emits white light together with the peak of blue light, the objects and environment that are illuminated by this light looks more crispy to the human naked eye. In particular, the peak of blue light provides this effect. The illuminated objects reflect, together with reflection a portion of the white light, a portion of the peak of blue light. The reflected portion of the peak of blue light is experienced by the human naked eye as if the object comprises brighteners. Thus, one may illuminate objects without brighteners with the light emitting module and the objects looks to the human naked eye as if brighteners were added. Thus, when, for example, a 100% white reflecting surface (without brighteners) is placed besides a sheet of white paper with brighteners, both surfaces appear to the human naked as crispy white.

The emitted white light having a color point that is substantially on the BBL, i.e. within 15 SDCM ("Standard Deviation of Colour Matching") from the BBL during operation of the lighting device, even more especially within 10 SDCM, yet even more especially within 5 SDCM.

The Full Width Half Maximum (FWHM) value of the peak of blue light has to be smaller than 70 nanometer. In an embodiment, the FWHM value is smaller than 60 nanometer, or smaller than 50 nanometer or even smaller than 40 nanometer. In an embodiment, the peak wavelength of the peak of blue light is in a range from 445 to 465 nanometer.

Note that the visual crispiness of an illuminated object relates to the human perception of the light that the human naked eye receives from the illuminated object. If more blue light is received, and more in particular, if more blue light in the range from 440 to 470 nanometer is received from the illuminated object, the illuminated object appears to be more crispy to the human naked eye. This applies in particular to white surfaces. If the human naked eye receives more blue light in the particular wavelength range from 440 to 470 nanometer from a white surface, a human person qualifies the white surface as a better/more white surface—often this is qualified as an excellent white rendition. White rendition refers a quality of the white appearance of a white object when being illuminated by a specific light emitting module or specific light source.

Optionally, the light emitting module does not emit Ultraviolet light and does not emit violet light.

Optionally, the color point of the first light is on the black body line and the combination of the first light and the peak of blue light has a combined color point. Thus, the combined color point is the color point of the light emitting module as a whole. The first light emitting element emits a first amount of energy of first light, the second light emitting element emits a second amount of energy of the peak of blue light, and a ratio between the first amount of energy and the second amount of energy is selected to obtain a coordinate for the combined color point in the CIEXYZ color space in an area enclosed by the black body line and a line defined by y=0.328+0.13x. Optionally, the x-coordinate of the combined color point is in a range from 0.376 to 0.445. The inventors have found that the crispy effect, when an object is illuminated by the light emitting module, is well visible when the color point of the light emission of the light emitting module is in the above defined area and is even better visible when the x-coordinate in the above defined range.

Optionally, the first light has a color distribution that is a substantially continuous spectrum from at least 470 nanometer to 700 nanometer. In the CIE XYZ color space, the combination of the peak of blue light and the first light has a color point that has been moved, compared to the color point of the first light, slightly to the left and in a downwards direction. One may obtain this color point also by mixing, for example, blue, red and green light without creating a substantially continuous spectrum that comprises the peak in between 440 nanometer and 470 nanometer. An advantage of the continuous spectrum is that the color rendering index of the light is relatively high. A substantially continuous spectrum from at least 470 nanometer to 700 nanometer means that at about each wavelength in that range light is emitted, thus, the line that describes the spectrum does not comprise interruptions (an interruption is a value of about 0).

Optionally, the first light has a color temperature in a range from 2000 to 4000 Kelvin. The inventors have found that when the peak of blue light is added to white light of a color temperature in the above range, the effect of the illuminated object looks crispy is well visible to the human naked eye. In other words, in this range of color temperatures, the amount of light in the peak of blue light does not need to be very large to obtain a sufficient effect of the illuminated object looks more 'crispy' when being illuminated by the lighting emitting module.

Optionally, the first light has a color rending index (CRI) in the range from 80 to 100. In an embodiment, the color rendering index (CRO) of the first light is in the range from 90 to 100. The inventors have found that when the peak of blue light is added to white light of a CRI in the above range, the effect of the illuminated object looks crispy is well visible to the human naked eye. In other words, in this CRI range, the amount of light in the peak of blue light does not need to be very large to obtain a sufficient effect of the illuminated object looks more 'crispy' when being illuminated by the lighting emitting module.

Optionally, the first light emitting element comprises a first light emitter and a first luminescent element. The first light emitter emits first blue light that has a peak wavelength in a spectral range from 440 nanometer to 460 nanometer. The luminescent element comprises luminescent materials and is configured to absorb a portion of the first blue light and to convert the absorbed portion toward another color distribution. The emitted light of the another color distribution and an emitted non-absorbed portion of the first blue light together form the first light. The second light emitting element comprises a second light emitter. Thus, the white light is generated by means of a light emitter that comprises, for example, one or more phosphors. Optionally, the second light emitter is configured to emit the peak of blue light. Thus, when the second light emitter is, for example, a solid state light emitter, it comprises a die which emits the peak of blue light and no specific other color conversions take place. Optionally, the second light emitting element comprises a second luminescent element that comprises luminescent material and is arranged to receive light emitted by the second light emitter. The luminescent material of the second luminescent element is configured to absorb light that is emitted by the second light emitter and to convert the absorbed light towards the peak of blue light. In other words, the second light emitting element obtains the peak of blue light by means of a color conversion by a luminescent material. This luminescent material is in particular configured to emit light that has the characteristics of the peak of blue light. The light emitted by the second light emitter may be UV light, or violet light, or blue light having a peak wavelength lower than 440 nanometer, but it is to be noted that, in an embodiment, all UV light or all violet light is absorbed by the light emitting module and is not emitted into the ambient of the light emitting module. In an embodiment, all UV light or all violet light is converted towards light of the peak of blue light. As discussed, the second light emitter may be a solid state light emitter, such as a Light Emitting Diode. However, the second light emitter may also be a laser diode which emits blue light with a wavelength within a spectral range from 440 nanometer to 470 nanometer. Laser diodes, in general, emit a narrow beam of light and, optionally, a scattering element and/or a diffusing element may be provided to scatter and/or diffuse the narrow beam of light into a wider beam of light. Optionally, a plurality of first light emitters may be provided which emit light towards the first luminescent element. Optionally, a plurality of second light emitters may be provided. A ratio between a number of first light emitter and a number of second light emitters is at least 2, or, in an embodiment, at least 3, or, in a further embodiment, at least 4.

Optionally, the light emitting module is configured to allow the switching on and off of the emission of the peak of blue light independently of the switching off and on of the emission of the first light. For example, when the first light emitting element comprises the previously discussed first light emitter and the second light emitting element comprises the previously discussed second light emitter, the first light emitter and the second light emitter have separate electrical connectors for receiving power such that a driving circuitry can drive the second light emitter independently of the first light emitter. In this last optional embodiment, the light emitting module may have several pins for receiving power, wherein, for example, a ground pin is shared by the first and the second light emitter and two driving pins for receiving a first driving voltage for driving the first light emitter and for receiving a second driving voltage for driving the second light emitter.

Optionally, the light emitting module comprises a third luminescent element and a third light emitter. The third luminescent element and a third light emitter together form the first light emitting element and together form the second light emitting element. In other words, the first light emitting element and the second light emitting element share the third luminescent element and share the third light emitter. The light emitter emits second blue light has optionally a peak wavelength in between 440 nanometer and 460 nanometer. The third luminescent element comprises luminescent materials that are configured to absorb a portion of the second blue light and convert the absorbed blue light towards a further color distribution. The light emitting module emits a mix of the further color distribution and, optionally, a non-absorbed portion of the second blue light (when not all second blue light is absorbed). The emitted mix of light has a spectral distribution which comprises the peak of blue light and which corresponds to white light if the peak of blue light is not taken into account. According to this optional embodiment it is possible to emit the white light with the peak of blue light by using a relatively small amount of different components. For example, only one type of third light emitter must be provided instead of using different types of light emitters in the first light emitting element and the second light emitting element. Optionally, the luminescent materials of the third luminescent element comprise a particular luminescent material that is configured to emit the peak of blue light. Optionally, the luminescent materials of the third luminescent element further comprise a mix of further luminescent materials. The amount of the further luminescent materials and the composition of the mix of further luminescent materials is selected such that this mix of further luminescent materials converts the absorbed blue light towards light that forms together with the optional non-absorbed portion of the second blue light a light the first light. In an embodiment, the particular luminescent material are particles showing quantum confinement and have at least in one dimension a size in the nanometer range. Examples of such particles are quantum dots, quantum rods and quantum tetrapods.

Optionally, the mix of further luminescent materials comprises a plurality of different types of particles showing quantum confinement and having at least in one dimension a size in the nanometer range. Each type of particles is configured to emit a different light emission when being excited and wherein the different types of particles are selected to obtain a combination of different light emissions that forms together a substantially continuous spectral distribution from at least 470 nanometer to about 700 nanometer.

According to another aspect of the invention, a lamp is provided which comprises a light emitting module according to any one of the above discussed embodiments of the light emitting module.

According to a further aspect of the invention, a luminaire is provided which comprises a light emitting module according to any one of the above discussed embodiments of the light emitting module or comprises a lamp according to the above discussed another aspect of the invention.

According to yet a further aspect of the invention, a method of illuminating an object is provided. The method comprises the stages of: i) emitting first light having a color point of white light, and ii) emitting an peak of blue light, the peak of blue light has a peak wavelength in a range from 440 nanometer to 470 nanometer and has a spectral width that is smaller than 70 nanometers, the spectral width being expressed as a full width half maximum value.

The lamp, the luminaire and method according to the above discussed aspects of the invention provides the same benefits as the light emitting module according to the first aspect of the invention and has similar embodiments with similar effects as the corresponding embodiments of the system.

These and other aspects of the invention are apparent from and will be elucidated with reference to the embodiments described hereinafter.

It will be appreciated by those skilled in the art that two or more of the above-mentioned options, implementations, and/or aspects of the invention may be combined in any way deemed useful.

Modifications and variations of the lamp, the luminaire and the method, which correspond to the described modifications and variations of the light emitting module, can be carried out by a person skilled in the art on the basis of the present description.

Figure 1A:
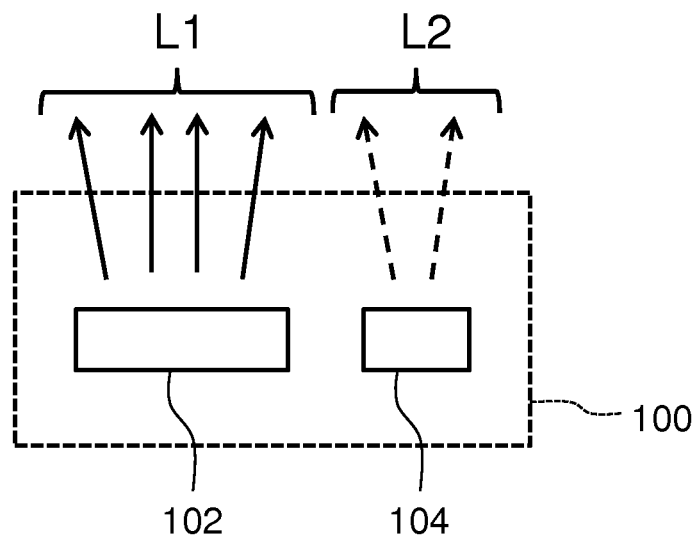
FIG. 1a schematically shows an embodiment of a light emitting module.

It should be noted that items denoted by the same reference numerals in different Figures have the same structural features and the same functions, or are the same signals. Where the function and/or structure of such an item have been explained, there is no necessity for repeated explanation thereof in the detailed description.

The Figures are purely diagrammatic and not drawn to scale. Particularly for clarity, some dimensions are exaggerated strongly.

DETAILED DESCRIPTION

A first embodiment is shown in FIG. 1a. FIG. 1a schematically shows an embodiment of a light emitting module 100. The light emitting module 100 comprises a first light emitting element 102 that is capable of emitting first light L1. The first light L1 has a color point that is substantially on a black body line in a color space or close to the black body line. In other words, the first light L1 is white light. The color point of the white light is within 15 SDCM ("Standard Deviation of Color Matching") from the black body line during operation of the light emitting element, even more especially within 10 SDCM, yet even more especially within 5 SDCM from the black body line. The light emitting module 100 further comprises a second light emitting element 104 that is configured to emit an peak of blue light L2. The peak of blue light L2 has a peak wavelength that is in a range from 440 nanometer to 470 nanometer and the peak has a spectral width that is smaller than 70 nanometer (when being expressed as a Full Width Half Maximum (FWHM) value). Optionally, the peak wavelength of the peak of blue light L1 is in a range from 445 to 465 nanometer. Optionally, the FWHM value is smaller than 60 nanometer, or smaller than 50 nanometer or even smaller than 40 nanometer. The light emitting module 100 emits a mix of white light L2 and the peak of blue light L2.

Figure 1B:
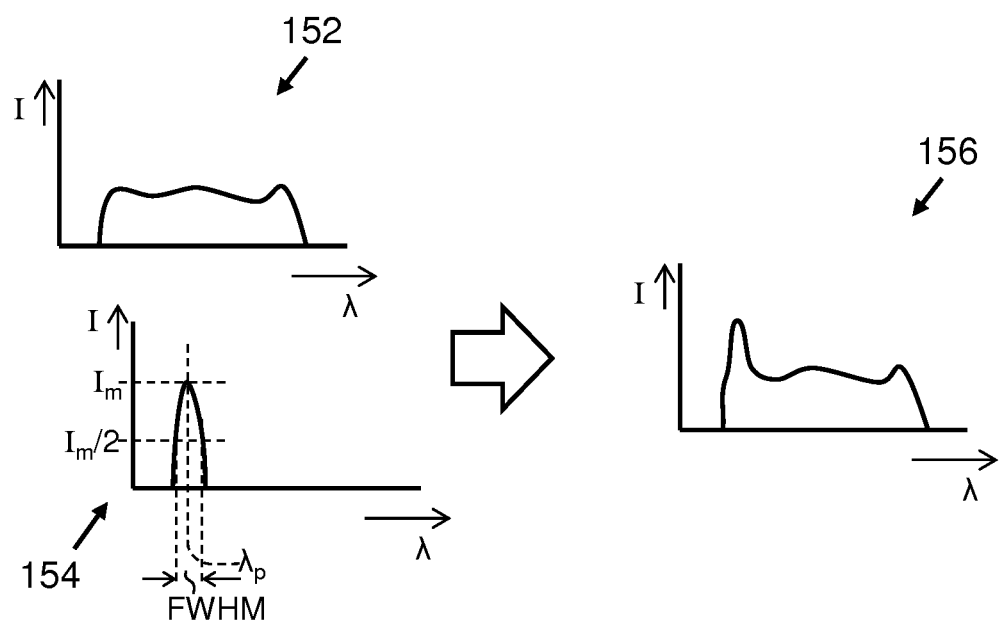
FIG. 1b schematically shows how in the light emitting module light emission spectra are combined to obtain a light emission spectrum for illuminating objects to obtain a 'crispy' look, FIG. 2 schematically shows several embodiments of the light emitting modules, FIG. 3a schematically shows a further embodiment of a light emitting module, FIG. 3b schematically shows how in the light emitting module of the further embodiment light emission spectra are combined to obtain a light emission spectrum for illuminating objects to obtain a 'crispy' look, FIG. 4a schematically shows an embodiment of a lamp, FIG. 4b schematically shows an embodiment of a luminaire, FIG. 5 schematically shows an embodiment of a method of illuminating an object, and FIGS. 6a and 6b schematically present in a CIEXYZ color space areas for a combined color point of the light emission of the light emitting module.

FIG. 1b schematically shows how in the light emitting module 100 light emission spectra 152, 154 are combined to obtain a light emission spectrum 156 for illuminating objects to obtain a 'crispy' look. The light emission spectrum 152 represents the light emission by the first light emitting element 102. The light emission spectrum 154 represents the light emission by the second light emitting element 104. As is seen, the light emission spectrum 154 is a relatively small peak of light which as a peak wavelength $\lambda_p$ which has a value in the range from 440 nanometer to 470 nanometer. The full width half maximum (FWHM) value of the peak (measured at half the maximum intensity $I_m/2$ of the peak intensity $I_m$) is smaller than 70 nanometer.

An insight of the inventors is that when an emission spectrum of white light 152 is combined with the peak of blue light L2 (as shown in light emission spectrum 154), one can use light of the obtained light emission spectrum 156 to illuminate objects such that the objects look more crispy, more fresh, more appealing or, when it relates to a white object, it looks more white to the human naked eye. This effect of a more crispy or more white looking object is obtained without introducing brighteners in the objects.

Figure 2:
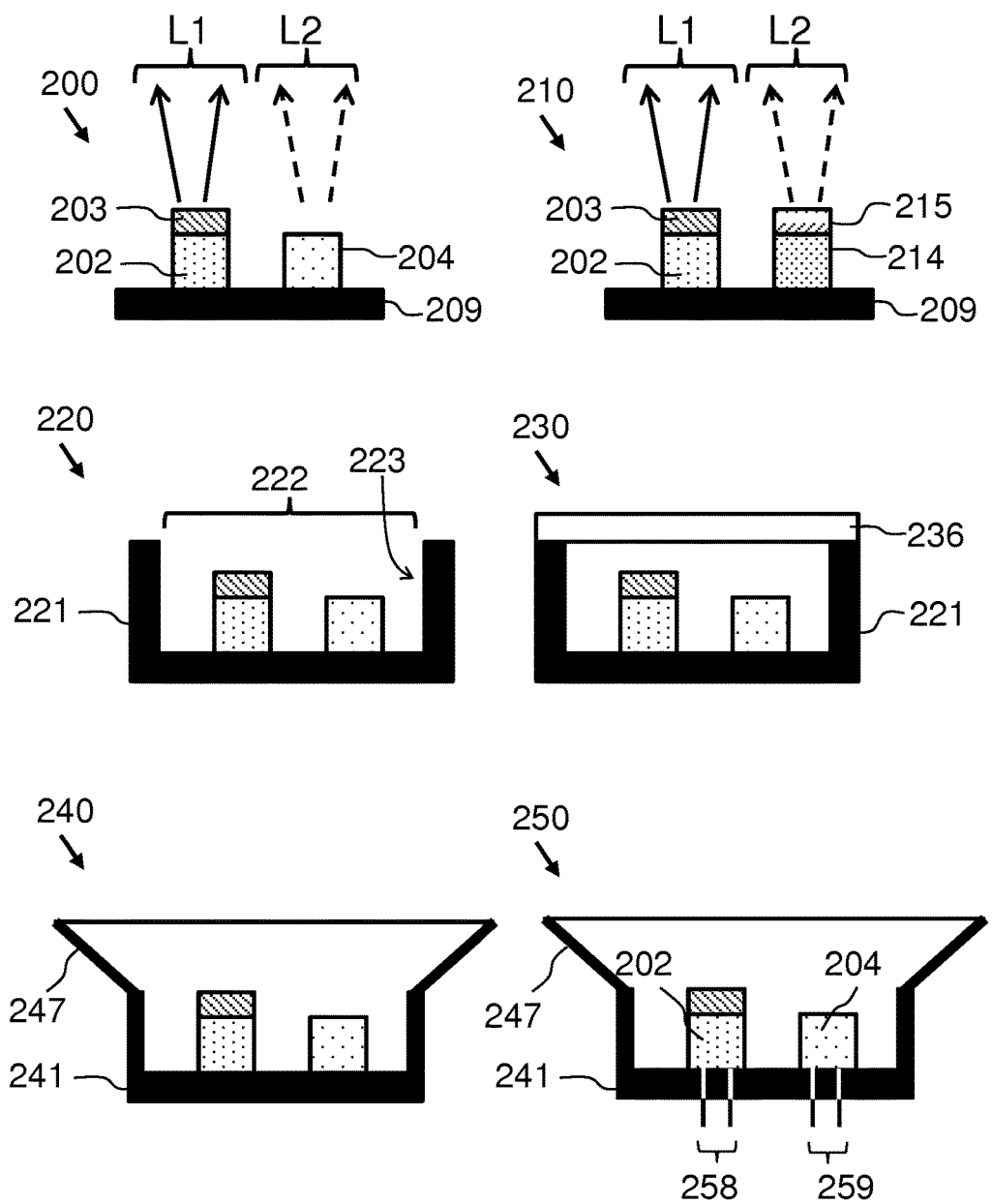

FIG. 2 presents several alternative embodiments of the light emitting module 100 of FIG. 1.

Light emitting module 200 comprises a first light emitter 202 which is provided by a first luminescent element 203. The light that is generated by the combination of the first light emitter 202 and the first luminescent element 203 is the first light L1 (with a color point of white light). The first light emitter 202 may emit, for example, blue light that is partially of fully converted by luminescent material of the first luminescent element 203 towards light of one or more other colors. When not all blue light (that is emitted by the first light emitter 202) is converted towards light of another color, a remaining portion of the blue light emitted by the first light emitter 202 may also be emitted into an ambient of the light emitting module 200. The combination of this optional remaining portion of blue light and the light that is emitted by the luminescent material of the first luminescent element forms the first light L1 having a color point of white light. The light emitting module 200 further comprises a second light emitter 204 which is configured to emit the peak of blue light L2—in other words, the second light emitter 204 directly emits the peak of blue light L2 without using any specific conversion of light. The first light emitter 202 and the second light emitter 204 may be provided on a support layer 209. The support layer 209 may be a good thermal conductor which conducts heat away from the first light emitter 202 and the second light emitter 204. Although the first luminescent element 203 is drawn in FIG. 2 as an element that is directly provided on top of the first light emitter 202, there may be (an air) gap present between the first luminescent element 203 and the first light emitter 202 (such that the first luminescent element 203 is arranged in a vicinity configuration or in a remote configuration depending on a width of the gap, which width may be, 0.1-0.5 mm or more than 1 cm, respectively).

Light emitting module 210 is similar to the light emitting module 200, however, it comprises another second light emitter 214 which is provided with a second luminescent element 215. The another second light emitter 214 emits light towards the second luminescent element 215 and luminescent material provided in the second luminescent element 215 converts the light emitted by the another second light emitter 214 towards the peak of blue light L2. The light emitted by the second light emitter 214 may be Ultraviolet (UV) light, may be violet light or may be blue light with a peak wavelength below the peak wavelength of the peak of blue light L2. In an embodiment, the combination of the second luminescent element 215 and the second light emitter 214 is arranged such that no UV or no violet light is emitted into an ambient of the light emitting module 210.

Light emitting module 220 is similar to light emitting module 200, however, instead of the support layer 209 is provided a box-shaped support member 221 which comprises at least one side a light exit window 222. An inner surface 223 of the box-shaped support member 221 may be reflective white such that light which impinges on the inner surface 223 is well-reflected, not absorbed and is better mixed by the light emitting module 220.

Light emitting module 230 is similar to light emitting module 220, however, an additional light diffusing element 236 is provided at the light exit window of the box-shaped support member 221. A diffusing element 236 may be a layer of glass or of a light transmitting synthetic material on which or in which scatting particles are provided. Diffusing the light results in a more homogeneous light output.

Light emitting module 240 is similar to light emitting module 220, but another box-shaped support member 241 is provided which comprises a reflector for shaping a light beam emitted by the light emitting module 240 in a specific shape.

Light emitting module 250 is similar to light emitting module 240 and comprises for each one of the light emitters 202, 204 separate power connectors 258, 259 for providing power separately to each one of the light emitters 202, 204. The power connectors 258, 259 are, for example provided at an outer surface of the light emitting module 250 that faces away form a light exit window of the light emitting module 250. The power connectors 258, 259 allow the separate driving of the first light emitter 202 and the second light emitter 204 and, thereby, one may, for example, implement that the second light emitter 204 can be switched off when the "crispy look" of the illuminated object is not required.

The first light emitter 202, the second light emitter 204 and the another second light emitter 214 may be solid state light emitters. An example of a solid state light emitter is a Light Emitting Diodes. Other examples are an Organic Light Emitting Diode or a laser diode. The laser diode can be used to generate the peak of blue light L2. When a laser diode is used, the light emitting module comprises preferably a light diffusing element such as light diffusing element 236.

It is further to be noticed that, in an embodiment, the first luminescent element 203 comprises a plurality of luminescent materials such that the combination of the light emitted by the plurality of luminescent materials (optionally combined with a remaining non-absorbed portion of the light emitted by the first light emitter 202) is the first light L1.

In the above, one first light emitter 202 and one second light emitter 204 (or one another second light emitter 214) are drawn. The embodiments are not limited to such a low number of light emitters. The light emitting modules 200, 210, 220, 230, 240, 250 may comprises a plurality of first light emitters 202 each provided with a first luminescent element 203. The light emitting modules 200, 210, 220, 230, 240, 250 may comprise a plurality of second light emitters 204. The light emitting modules 200, 210, 220, 230, 240, 250 may comprises a plurality of another second light emitters 214 each provided with the second luminescent element 215. In an embodiment, a ratio between the number of first light emitters 202 and the number of second light emitters 204 (or, alternatively, the another second light emitters 214) is at least 1, or at least 2, or at least 3. In general, it is advantageous when more white light is emitted than the amount of light that is emitted in the peak of blue light, because otherwise it might result in illuminating an object with blue light instead of light that provides a "crispy" effect.

The first luminescent element 203 and the second luminescent element 215 may comprise at least one of the follow types of luminescent materials: an inorganic phosphor, an organic phosphor, for example, based on perylene derivatives, or particles showing quantum confinement and have at least in one dimension a size in the nanometer range. Showing quantum confinement means that the particles have optical properties that depend on the size of the particles. Examples of such materials are quantum dots, quantum rods and quantum tetrapods. The first luminescent element 203 and the second luminescent element 215 may also comprise a mix of the above discussed materials.

Figure 3A:
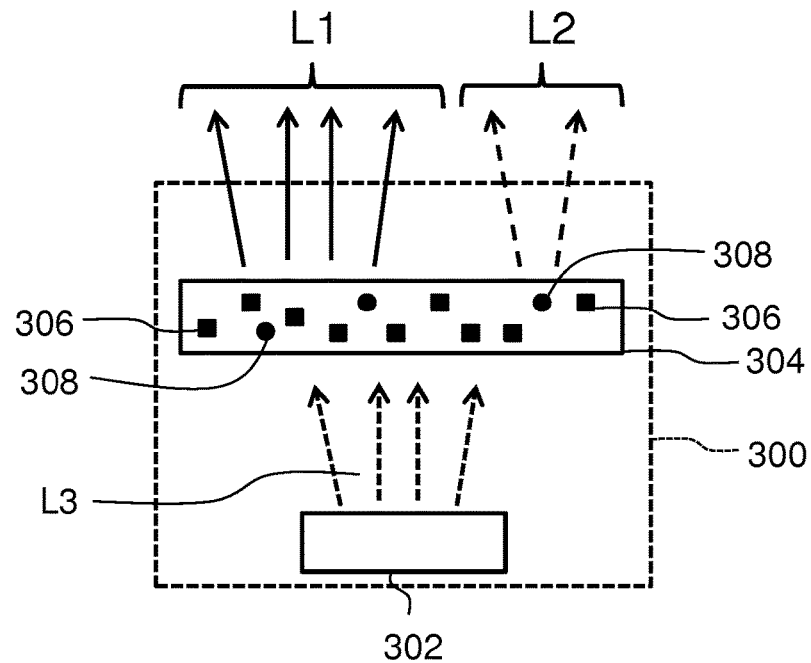
Figure 3B:
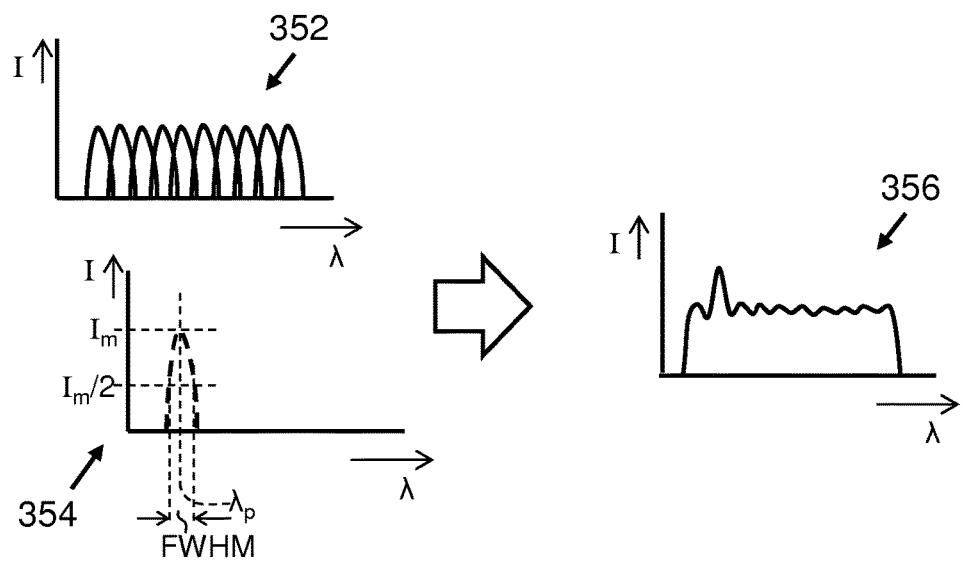

FIG. 3a schematically shows a further embodiment of a light emitting module 300. The light emitting module 300 comprises one type of a light emitter 302 which emits third light L3. Optionally, the third light L3 is blue light and has a peak wavelength in a range from 440 nanometer to 460 nanometer. In FIG. 3 it has been drawn that only a single third light emitter 302 is provided, but a plurality of third light emitters 302 may be provided to emit a larger amount of third light L3. The third light L3 is emitted towards a third luminescent element 304. The third luminescent element 304 comprises one specific luminescent material 308 that absorbs some of the third light L3 and converts the absorbed light towards the peak of blue light L2. The third luminescent element 304 further comprises a mix of other luminescent materials 306 which together emit (optionally, in combination with a non-absorbed portion of the third light L3) a light emission that corresponds to the first light L1 (and, thus, white light). In comparison with previous embodiment, a plurality of luminescent material 306, 308 generates the first light L1 and the peak of blue light L2. This is illustrated in FIG. 3b. FIG. 3b schematically shows how in the light emitting module 300 light emission spectra 352, 354 are combined to obtain a light emission spectrum 356 to obtain a 'crispy' look of illuminated objects. For example, when the third luminescent element 304 comprises different types of Quantum Dots which all have a slightly different size (and/or are of different materials), they each may emit a slightly shifted peak of light and neighboring peaks of light may slightly overlap such that, about a continuous light emission is obtained (as shown in light emission spectrum 352). Another Quantum Dot may be added as well which has a specific size and a specific material that is configured to emit the peak of blue light as is shown in light emission spectrum 354. Together, the light emissions 352 and 354 result in the light emission spectrum 356. When an object is illuminated by the light emission spectrum 356, the object has a "crispy", more "fresh", more white appearance when seen through the human naked eye.

The light emission spectrum 352 is an example of a spectrum which may be generated by the mix of other luminescent materials 306 (optionally, the light emission spectrum 352 also comprises a non-absorbed portion of the third light L3). As discussed above, such light emission spectrum 352 may be obtained by combining several slightly different Quantum Dots. As discussed above, Quantum Dots are particles showing quantum confinement and have at least in one dimension a size in the nanometer range, which means that the particles have optical properties that depend on the size of the particles. Thus, the mix of other luminescent materials 306 may comprises several Quantum dots of different sizes. It is to be noted that other particles that show quantum confinement are quantum rods of quantum tetrapods and that, instead of or in addition to Quantum Dots, these materials could be present in the mix of other luminescent materials 306. It is to be noted that, in other embodiments, other mixes of luminescent materials can be used to generate (optionally, together with an emitted non-absorbed portion of the third light L3) the first (white) light L1. For example, the mix of other luminescent materials 306 may also comprise one of: inorganic phosphors, or organic phosphors (such as, for example, perylene derivatives).

Examples of luminescent materials comprises particles showing quantum confinement and have at least in one dimension a size in the nanometer range. This means, for example, that, if the particles are substantially spherical, their diameter is in the nanometer range. Or, this means, for example, if they are wire-shaped, that a size of a cross-section of the wire is in one direction in the nanometer range. A size in the nanometer range means that their size is at least smaller than 1 micrometer, thus, smaller than 500 nanometer, and larger or equal to 0.5 nanometer. In an embodiment, the size in one dimension is smaller than 50 nanometer. In another embodiment the size in one dimension is in the range from 2 to 30 nanometer. In embodiments of the invention the luminescent materials may comprise quantum dots. Quantum dots are small crystals of semiconducting material generally having a width or diameter of only a few nanometers. When excited by incident light, a quantum dot emits light of a color determined by the size and material of the crystal. Light of a particular color can, therefore, be produced by adapting the size of the dots. Most known quantum dots with emission in the visible range are based on cadmium selenide (CdSe) with shell such as cadmium sulfide (CdS) and zinc sulfide (ZnS). Cadmium free quantum dots such as indium phosphide (InP), and copper indium sulfide ($CuInS_2$) and/or silver indium sulfide ($AgInS_2$) can also be used. Quantum dots show very narrow emission band and thus they show saturated colors. Furthermore, the emission color can easily be tuned by adapting the size of the quantum dots. Any type of quantum dot known in the art may be used in the present invention, provided that it has the appropriate wavelength conversion characteristics. However, it may be preferred for reasons of environmental safety and concern to use cadmium-free quantum dots or at least quantum dots having a very low cadmium content.

Figure 4A:
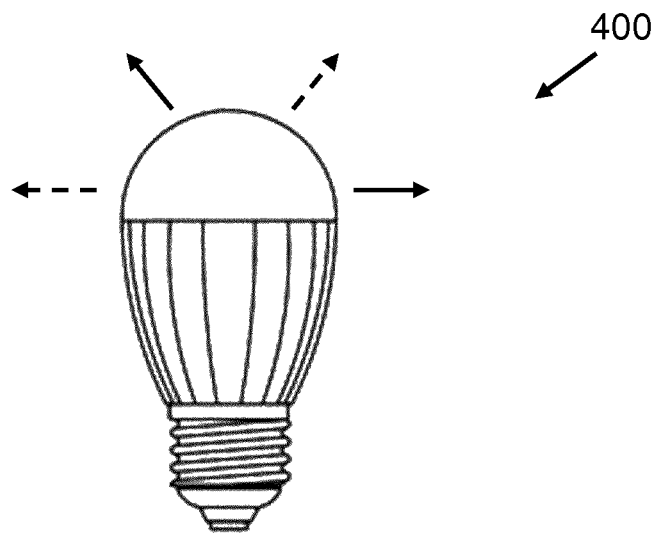

FIG. 4a schematically shows an embodiment of a lamp 400. The lamp 400 has, for example, a shape of a traditional incandescent lamp and is, as such, a retro-fit incandescent lamp. The lamp may comprise, for example, one or more light emitting modules (not shown) according to previously discussed embodiments of the light emitting modules.

Figure 4B:
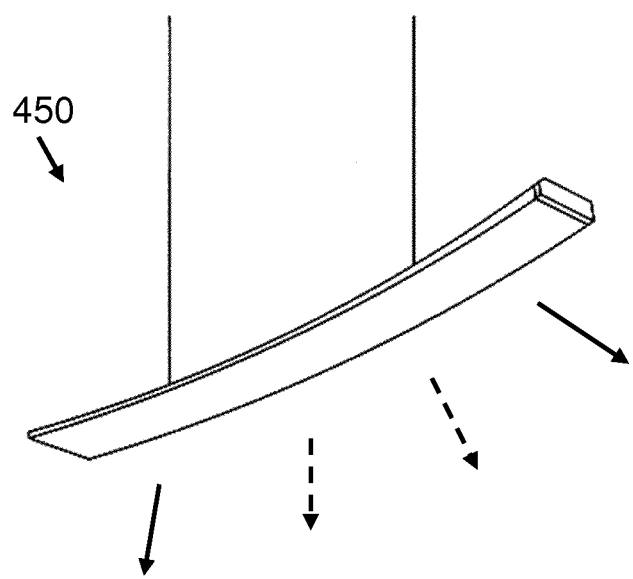

FIG. 4b schematically shows an embodiment of a luminaire 450. The luminaire 450 comprises, for example, one or more light emitting modules (not shown) according to previously discussed embodiments of the light emitting modules. In another embodiment, the luminaire 450 comprises one or more lamps (not shown) according to the embodiment of FIG. 4a.

Figure 5:
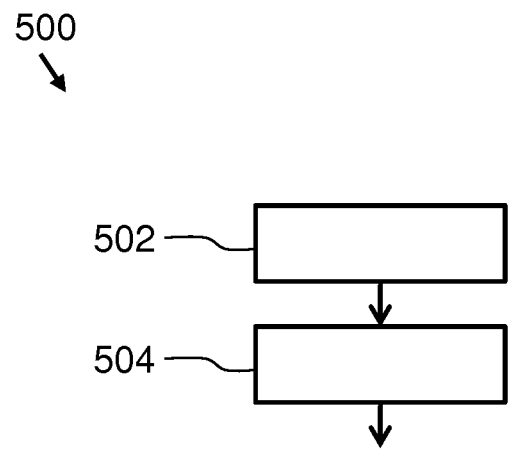

FIG. 5 schematically shows an embodiment of a method 500 of illuminating an object. The method 500 comprises the stages of: i) emitting 502 first light having a color point of white light, ii) emitting 504 an peak of blue light, the peak of blue light has a peak wavelength in a range from 440 nanometer to 470 nanometer and has a spectral width that is smaller than 70 nanometers when being expressed as a full width half maximum value.

The lamp, the luminaire and the above discussed method of illuminating an object have similar embodiment with a similar effect as the embodiment of the light emitting module.

Figure 6A:
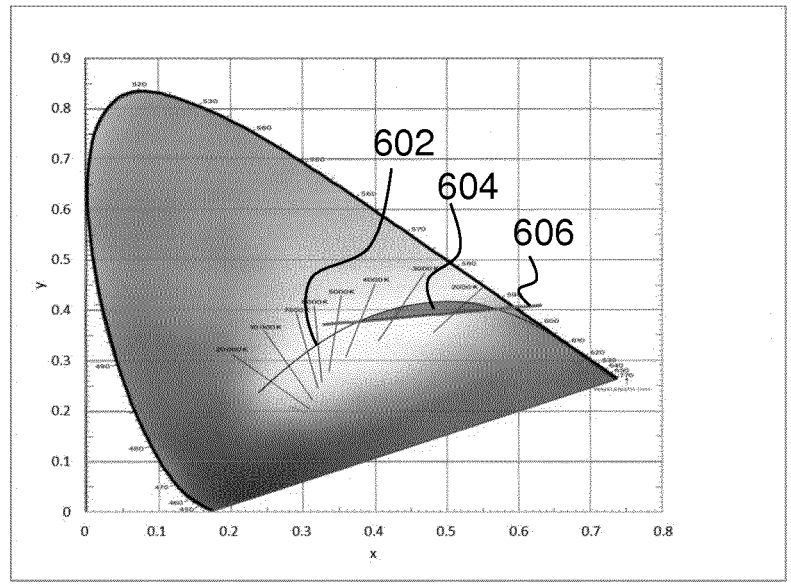
Figure 6B:
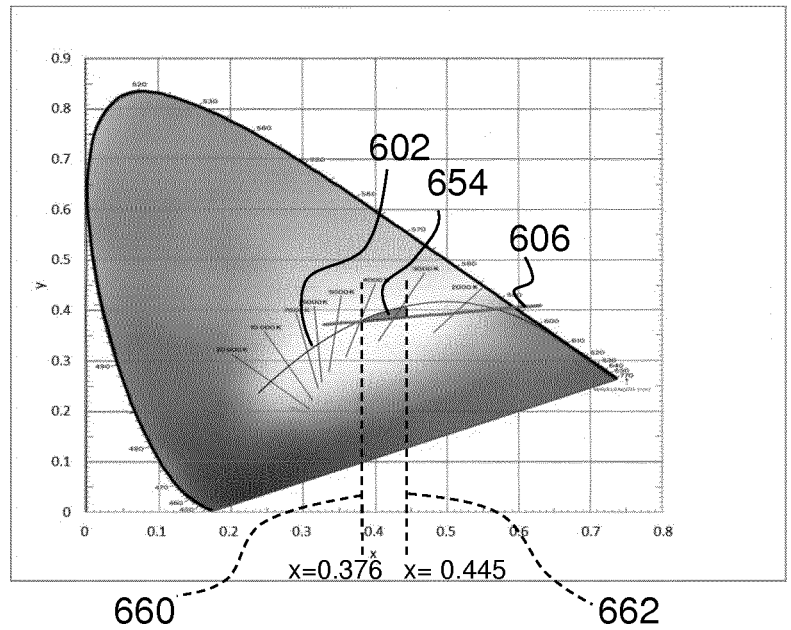

FIGS. 6a and 6b schematically present in a CIEXYZ color space areas for a combined color point of the light emission of the light emitting module. In FIG. 6a a first chart 600 of the CIEXYZ color space is presented. In the CIEXYZ color space is drawn the black body line 602. The first light emitting element emits first light that has a color point on the black body line. The combination of the first light and the peak of blue light has a combined color point. Thus, the combined color point is the color point of the light emitting module as a whole. The first light emitting element emits a first amount of energy of first light, the second light emitting element emits a second amount of energy of the peak of blue light, and a ratio between the first amount of energy and the second amount of energy is selected to obtain a coordinate for the combined color point in the CIEXYZ color space in an area 604 enclosed by the black body line 602 and a line 606 defined by y=0.328+0.13x. Within area 604 the crispy effect is well visible to the human naked eye. The area 604 may be further limited such that the crispy effect is even better visible. This is shown in chart 650 of FIG. 6b. In FIG. 6b the area 654 in which the combined color point may be located is further limited by a first line 660 defined by x-coordinate 0.376 and a second line 662 defined by x-coordinate 0.445. Thus, the area 654 is an area in between the black body line, 602, the line 606 defined by y=0.328+0.13x, a line 660 defined by x=0.376 and a line 662 defined by x=0.445.

It should be noted that the above-mentioned embodiments illustrate rather than limit the invention, and that those skilled in the art will be able to design many alternative embodiments without departing from the scope of the appended claims.

In the claims, any reference signs placed between parentheses shall not be construed as limiting the claim. Use of the verb "comprise" and its conjugations does not exclude the presence of elements or steps other than those stated in a claim. The article "a" or "an" preceding an element does not exclude the presence of a plurality of such elements. In the device claim enumerating several means, several of these means may be embodied by one and the same item of hardware. The mere fact that certain measures are recited in mutually different dependent claims does not indicate that a combination of these measures cannot be used to advantage.

The invention claimed is:

1. A light emitting module for illuminating an object, the light emitting module comprising:
   a first light emitting element comprising a first light emitter and a first luminescent element, the first light emitting element configured to emit a first light having a color point of white light, the first light emitter configured to emit a first blue light that is at least partially converted by the first luminescent element to a light of another color, wherein the first light represents a combination of the at least partially converted first blue light and any unconverted first blue light;
   a second light emitting element configured to emit a peak of second blue light, the peak of second blue light having a peak wavelength in a range from 440 nanometer to 470 nanometer and having a spectral width that is smaller than 70 nanometers, the spectral width being expressed as a full width half maximum value, and the peak of second blue light being combined with the first light to form crispy white light having a light emission spectrum having more blue light in the range from 440 nanometer to 470 nanometer than the white light, such that when the light emitting module illuminates the object, an effect of using brighteners in the object is realized.

2. The light emitting module according to claim 1, wherein
   the color point of the first light is substantially on a black body line,
   the combination of the first light and the peak of second blue light has a combined color point,
   the first light emitting element emits a first amount of energy of first light, the second light emitting element emits a second amount of energy of the peak of second blue light, and a ratio between the first amount of energy and the second amount of energy is selected to obtain a coordinate for the combined color point in an area enclosed by the black body line and a line defined by y=0.328+0.13x, in the CIEXYZ color space, and
   optionally, the x-coordinate of the combined color point is in a range from 0.376 to 0.445.

3. The light emitting module according to claim 1, wherein the first light has at least one of the following characteristics:
   color temperature in a range from 2000 Kelvin to 4000 Kelvin, and
   a color rendering index in a range from 80 to 100.

4. The light emitting module according to claim 1, wherein
   the first light emitter being configured to emit the first blue light having a peak wavelength in a spectral range from 440 nanometer to 460 nanometer, wherein the emitted light of the another color distribution and an emitted non-absorbed portion of the first blue light together form the first light, and
   the second light emitting element comprising a second light emitter.

5. The light emitting module according to claim 1, wherein the second light emitting element comprises a second luminescent element, wherein the second luminescent element comprises luminescent material being configured to absorb light emitted by the second light emitter and to convert the absorbed light towards the peak of second blue light.

6. The light emitting module according to claim 1, wherein the second light emitting element comprising a solid state light emitter.

7. The light emitting module according to claim 1, wherein the first light emitter is a solid state light emitter.

8. The light emitting module according to claim 1, wherein the light emitting module is configured to allow a switching off and on of the emission of the peak of second blue light independently of the switching off and on of the emission of the first light.

9. The light emitting module according to claim 1 comprising a third luminescent element and a third light emitter, wherein the third luminescent element and the third light emitter together form the first light emitting element and together form the second light emitting element, the third light emitter being configured to emit second blue light, the third luminescent element comprising luminescent materials being configured to absorb a portion of the second blue light and convert the absorbed blue light towards a further color distribution, wherein the light emitting module is configured to emit a mix of the further color distribution and, optionally, a non-absorbed portion of the second blue light, and the light emitted by the light emitting module has a spectral distribution which comprises the peak of second blue light and forms the first light if the peak of second blue light is not taken into account, optionally, the second blue light having a peak wavelength in between 400 nanometer and 460 nanometer.

10. The light emitting module according to claim 9, wherein the third luminescent element comprises a particular luminescent material being configured to emit the peak of blue light.

11. The light emitting module according to claim 10, wherein the third luminescent element further comprises a mix of further luminescent materials, wherein the amounts of the further luminescent materials and the composition of the mix of the further luminescent materials is configured to convert the absorbed second blue light towards light that forms together with the optional non-absorbed portion of the second blue light the first light.

12. The light emitting module according to claim 11, wherein the mix of further luminescent materials comprises a plurality of different types of particles showing quantum confinement and having at least in one dimension a size in the nanometer range, each type of particles is configured to emit a different light emission when being excited, wherein the different types of particles are selected to obtain a combination of the different light emissions forming a substantially continuous spectral distribution from at least 470 nanometer to 700 nanometer.

13. A lamp comprising the light emitting module according to claim 1.

14. A luminaire comprising a light emitting module according to claim 1.

15. A method of illuminating an object, the method comprises:
    emitting first light having a color point of white light towards the object,
    emitting a peak of blue light towards the object, the peak of blue light has a peak wavelength in a range from 440 nanometer to 470 nanometer and has a spectral width that is smaller than 70 nanometers, the spectral width being expressed as a full width half maximum value, and the peak of blue light is combined with the white light to form crispy white light having a light emission spectrum having more blue light in the range from 440 nanometer to 470 nanometer than the white light.

* * * * *